(12) United States Patent
Li et al.

(10) Patent No.: US 9,083,343 B1
(45) Date of Patent: Jul. 14, 2015

(54) CASCODE SWITCHING CIRCUIT

(71) Applicant: United Silicon Carbide, Inc., Monmouth Junction, NJ (US)

(72) Inventors: Xueqing Li, East Brunswick, NJ (US); Anup Bhalla, Princeton Junction, NJ (US)

(73) Assignee: United Silicon Carbide, Inc., Monmouth Junction, NJ (US)

( * ) Notice: Subject to any disclaimer, the term of this patent is extended or adjusted under 35 U.S.C. 154(b) by 0 days.

(21) Appl. No.: 14/525,863

(22) Filed: Oct. 28, 2014

Related U.S. Application Data

(60) Provisional application No. 62/003,637, filed on May 28, 2014.

(51) Int. Cl.
  *H03K 17/56* (2006.01)
  *H03K 17/687* (2006.01)

(52) U.S. Cl.
  CPC ...... *H03K 17/687* (2013.01); *H03K 2017/6875* (2013.01)

(58) Field of Classification Search
  CPC ............. H03K 17/687; H03K 2017/6875
  See application file for complete search history.

(56) References Cited

U.S. PATENT DOCUMENTS

| | | | |
|---|---|---|---|
| 4,663,547 A | 5/1987 | Baliga et al. | |
| 7,777,553 B2 * | 8/2010 | Friedrichs | 327/436 |
| 8,228,114 B1 | 7/2012 | Cilio | |
| 8,487,667 B2 | 7/2013 | Iwamura | |
| 2008/0197908 A1 * | 8/2008 | Williams | 327/431 |
| 2013/0335134 A1 * | 12/2013 | Kanazawa et al. | 327/404 |
| 2014/0027785 A1 | 1/2014 | Rose | |
| 2014/0091852 A1 * | 4/2014 | Norling et al. | 327/409 |

* cited by examiner

*Primary Examiner* — Jung Kim
(74) *Attorney, Agent, or Firm* — Baker & Hostetler LLP

(57) ABSTRACT

Disclosed herein are cascode switching circuits that include a normally-on semiconductor device, a normally-off semiconductor device, and a gate driver. The normally-on semiconductor device and said normally-off semiconductor device each has a gate terminal, a drain terminal and a source terminal. The gate driver has a first output and a second output, the first output of said gate driver is coupled to said gate terminal of said normally-on semiconductor device, the second output of said gate driver is coupled to said gate terminal of said normally-off semiconductor device, and the drain terminal of said normally-off semiconductor device is coupled to said source terminal of said normally-on semiconductor device so that a current path is formed through said normally-on semiconductor device and said normally-off semiconductor device. Methods of making and using such circuits, and other various aspects of such circuits are also disclosed.

28 Claims, 6 Drawing Sheets

CASCODE SWITCHING CIRCUIT

CROSS REFERENCE TO RELATED APPLICATIONS

This Application claims the benefit of U.S. Provisional Application Ser. No. 62/003,637 filed May 28, 2014, the disclosure of which is hereby incorporated by reference as if set forth in its entirety.

BACKGROUND

The present invention relates generally to semiconductor switching devices and gate driving methods and, in particular, to driving switches comprising a normally-off semiconductor device and a normally-on high voltage wide bandgap semiconductor device in cascode arrangement.

The compound semiconductors, such as silicon carbide (SiC) and gallium nitride (GaN), have a bandgap or energy difference between the top of the valence band and the bottom of the conduction band typically greater than 2 electron volts, therefore these semiconductors are called wide bandgap semiconductors. The wide bandgap semiconductors have a much higher breakdown field than silicon; for example, the breakdown field of silicon carbide is about $3\times10^6$ volts per centimeter, which is about 10 times higher than the breakdown field of silicon. The properties of a wide bandgap and a high breakdown field allow the power devices made with wide bandgap semiconductors to block higher voltage with lower on-resistance, switch at higher frequency with higher efficiency, and operate at higher temperatures with less cooling requirements. These device characteristics are critical for implementing a high voltage, high temperature, high frequency and high power density power conversion system.

Tremendous efforts have been invested to develop SiC junction field effect transistors (JFETs), SiC metal-oxide-semiconductor field effect transistors (MOSFETs), and GaN high electron mobility transistors (HEMTs). Compared to SiC MOSFETs, SiC JFETs do not require a critical oxide film and therefore are free of oxide related issues of performance degradation and long-term reliability under high electric field and high junction temperature operation conditions. SiC JFETs are reliable at high temperature, and continue to undergo great advancement in specific on-resistance and switching figures of merit. By controlling the channel opening, a SiC JFET can be made to be normally-on or normally-off. A normally-on device is a device that is highly conductive, or in ON-state, when zero voltage is applied to its control terminal or gate. A normally-off device is a device that is highly resistive, or in OFF-state, when zero voltage is applied to its control terminal or gate. Normally-on SiC JFETs have demonstrated very low specific on-resistance. There is a penalty in specific on-resistance with normally-off SiC JFETs, and they require properly adjusted gate drives for optimal performance. As for GaN HEMTs, almost all of them are normally-on devices.

The best-performing SiC and GaN devices are normally-on devices. However, normally-on devices may produce a dangerous short circuit condition during the system startup or the gate drive supply failures, which make normally-on devices difficult to be applied in many power conversion applications. A method to overcome the challenge of using normally-on devices leverages the cascode concept disclosed by Baliga et al. in U.S. Pat. No. 4,663,547 entitled Composite Circuit for Power Semiconductor Switching, which comprises a low voltage normally-off MOSFET connected in series with a high voltage normally-on JFET and presents a normally-off operation mode when zero voltage is applied to its control terminal, the MOSFET gate. The advantages of the cascode device include normally-off operation mode, a built-in body diode with low forward voltage drop, and very low miller capacitance. The cascode device, as a composite circuit, contains many parasitic inductances from device bonding wires, package leads, and PCB traces. These parasitic inductances together with the capacitances of the two devices in the cascode might cause oscillations during switching process and result in instabilities under certain conditions. To ensure a reliable operation of the cascode, the instantaneous rate of voltage change over time (dv/dt) and the instantaneous rate of current change over time (di/dt) during switching process must be actively controlled. The MOSFET gate resistor and the parasitic inductance at the source of the cascode can be used to effectively control the di/dt and dv/dt of the turn-on process. However, complete control of the di/dt and dv/dt of the turn-off process of the cascode is more difficult than in the case of the turn-on process.

Various methods have been devised to control the switching process of the cascode. Rose, in U.S. patent application 20140027785 entitled Cascoded Semiconductor Devices, describes a method that uses a bootstrap capacitor connected between the gate of the high voltage normally-on device and the gate of the low voltage normally-off device in order to achieve an active control of both devices in a cascode circuit using a single gate driver. This method will develop a voltage drop across the bootstrap capacitor which reverses the bias of the gate-source junction of the normally-on device and results in a substantial increase in the on-resistance of the normally-on device.

Iwamura, in U.S. Pat. No. 8,487,667 entitled Hybrid Power Device, describes a method to control the cascode switching process with a resistor-capacitor-diode (RCD) network connected to the gate of the normally-on device. In order to attenuate the oscillations during the switching process to an acceptable level, this method reduces the switching speed significantly and increases the switching loss of the cascode circuit.

Friedrichs, in U.S. Pat. No. 7,777,553 entitled Simplified Switching Circuit, and Cilio, in U.S. Pat. No. 8,228,114 entitled Normally-off D-mode Driven Direct Drive Cascode, describe a direct drive method. In this method, the low voltage normally-off device is used as a protection device. In normal operation, the low voltage normally-off device is kept always on and the high voltage normally-on device is switched independently. During startup or a fault condition the normally-off device will be turned off, and the whole circuit will be turned off like a conventional cascode circuit. In this way, the direct drive cascode behaves like a stand-alone normally-on device and the limitations of the cascode circuit are avoided. However, this method needs a complicated gate driver to ensure proper safe operation of the cascode device.

Kanazawa et al., in U.S. Pat. Application No. 20130335134 entitled Semiconductor Device and System Using the Same, describes a method to control the cascode device. In this method, both normally-on and normally-off devices in the cascode are actively switched at the same time during the switching process and are actively maintained in OFF-state by their respective gate drive signal during OFF-state. With proper design of the delay time between the gate signals of the normally-on and normally-off devices, the cascode switching process will be very close to the switching process of a stand-alone normally-on device. However, the normally-on device is not suitable for reverse current conduction in this method because its gate terminal is kept at a low potential with respective to its source during OFF-state. The feature of the built-in body diode of the cascode device is not used. An additional freewheeling diode connected in parallel with the cascode device is required for the cascode device to conduct a reverse current.

Therefore, there is still a need for a cascode device having a simple gate drive circuit, controllable switching process, and a built-in body diode.

SUMMARY

An object of the present invention is to provide a cascode switching circuit having a simple gate drive circuit, controllable switching process, and a built-in body diode.

The present invention herein describes a cascode switching circuit including: a normally-on semiconductor device, a normally-off semiconductor device, and a gate driver circuit. The normally-on semiconductor device and the normally-off semiconductor device each can have a gate terminal, a drain terminal, and a source terminal. The gate driver can be provided with two outputs: a first output and a second output. The normally-on semiconductor device can be connected in series with the normally-off semiconductor device by coupling the drain terminal of the normally-off semiconductor device to the source terminal of the normally-on semiconductor device such that a current path is formed through both the normally-on and the normally-off semiconductor devices. The first output of the gate driver can be coupled to the gate terminal of the normally-on semiconductor device and the second output of the gate driver can be coupled to the gate terminal of the normally-off semiconductor device.

In different variations, the normally-on semiconductor device can be made from a range of varied elements and combinations of elements. For example, the normally-on device can be made from a compound semiconductor, such as silicon carbide (SiC) or gallium nitride (GaN). In different variations, the normally-on semiconductor device can comprise several different specific devices. For example, a silicon carbide normally-on semiconductor device can be a silicon carbide junction field effect transistor (JFET), and a gallium nitride normally-on semiconductor device can be a gallium nitride high electron mobility transistor (HEMT). The normally-on device can alternatively comprise any semiconductor device with a voltage blocking capability in the range of from about 600 volts to about 4000 volts. It may also comprise multiple semiconductor devices connected in parallel, such that together they have a voltage blocking capability in the range of from about 600 volts to about 4000 volts.

The normally-off semiconductor device can also comprise several different specific devices. For example, the normally-off device can be a silicon metal oxide semiconductor field effect transistor (MOSFET). The normally-off device may alternatively comprise any semiconductor device with a voltage blocking capability in the range of from about 10 volts to about 100 volts. It may also comprise multiple semiconductor devices connected in parallel, such that together they have a voltage blocking capability in the range of from about 10 volts to about 100 volts.

The gate driver can be configured such that the cascode switching circuit transitions from being highly resistive, or in OFF-state, to being highly conductive, or in ON-state, by switching the normally-off semiconductor device into ON-state. The gate driver can also be configured so that the cascode switching circuit transitions from ON-state to OFF-state by switching the normally-on semiconductor device into OFF-state.

The gate driver can be configured such that when the cascode switching circuit is in OFF-state, it enables the normally-on semiconductor device to conduct a reverse current flowing from the normally-on semiconductor device's source terminal to its drain terminal. If the normally-off semiconductor device is a silicon MOSFET, the built-in body diode of the MOSFET can conduct a reverse current. Therefore, the cascode switching circuit can conduct a reverse current during OFF-state.

The present invention herein describes a method of controlling the switching process of a cascode switching circuit. The method can include forming a cascode switching circuit with: a normally-on semiconductor device, a normally-off semiconductor device, and a gate driver circuit. The normally-on semiconductor device and the normally-off semiconductor device each can be formed with a gate terminal, a drain terminal, and a source terminal. The gate driver can be provided with two outputs: a first output and a second output. The normally-on semiconductor device can be connected in series with the normally-off semiconductor device by coupling the drain terminal of the normally-off semiconductor device to the source terminal of the normally-on semiconductor device such that a current path is formed through both the normally-on and the normally-off semiconductor devices. The first output of the gate driver can be coupled to the gate terminal of the normally-on semiconductor device and the second output of the gate driver can be coupled to the gate terminal of the normally-off semiconductor device.

In different variations, the method can include forming a normally-on semiconductor device with a range of varied elements and combinations of elements. For example, the method can include forming a normally-on device with a compound semiconductor, such as silicon carbide (SiC) or gallium nitride (GaN). In different variations, the method can include forming a normally-on semiconductor device with several different specific devices. For example, the method can include forming a silicon carbide normally-on semiconductor device with a silicon carbide junction field effect transistor (JFET), and a gallium nitride normally-on semiconductor device with a gallium nitride high electron mobility transistor (HEMT). The method can alternatively include forming a normally-on device with any semiconductor device with a voltage blocking capability in the range of from about 600 volts to about 4000 volts. It may also include forming the normally-on device from multiple semiconductor devices connected in parallel, such that together they have a voltage blocking capability in the range of from about 600 volts to about 4000 volts.

The method can include forming a normally-off semiconductor device with several different specific devices. For example, the method can include forming the normally-off device with a silicon metal oxide semiconductor field effect transistor (MOSFET). The method can alternatively include forming the normally-off device with any semiconductor device with a voltage blocking capability in the range of from about 10 volts to about 100 volts. It may also include forming the normally-off device with multiple semiconductor devices connected in parallel, such that together they have a voltage blocking capability in the range of from about 10 volts to about 100 volts.

The method can include configuring the gate driver such that the cascode switching circuit transitions from being highly resistive, or in OFF-state, to being highly conductive, or in ON-state, by switching the normally-off semiconductor device into ON-state. The method can also include configuring the gate driver such that the cascode switching circuit transitions from ON-state to OFF-state by switching the normally-on semiconductor device into OFF-state.

The method can include configuring the gate driver such that when the cascode switching circuit is in OFF-state, it enables the normally-on semiconductor device to conduct a reverse current flowing from the normally-on semiconductor device's source terminal to its drain terminal. If the normally-off semiconductor device is a silicon MOSFET, the built-in body diode of the MOSFET can conduct a reverse current. Therefore, the cascade switching circuit can conduct a reverse current during OFF-state.

BRIEF DESCRIPTION OF THE DRAWINGS

Additional aspects, features, and advantages of the invention will be understood and will become more readily apparent when the invention is considered in the light of the following description made in conjunction with the accompanying drawings.

DETAILED DESCRIPTION OF ILLUSTRATIVE EMBODIMENTS

Figure 1:
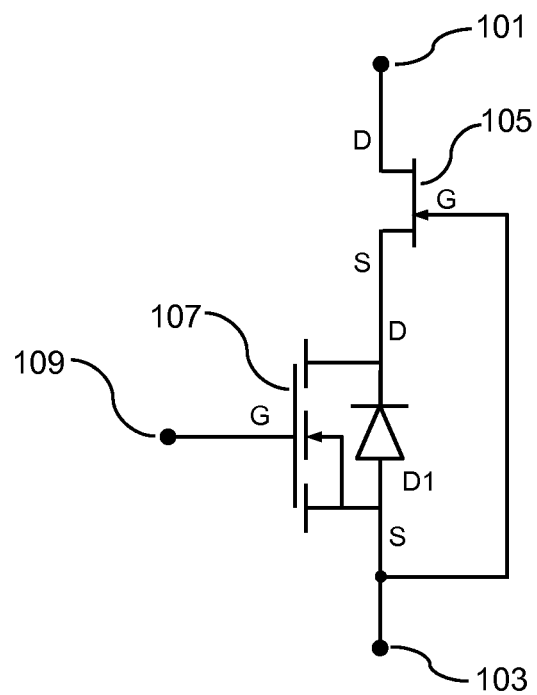
FIG. 1 is a circuit schematic diagram illustrating a conventional cascode circuit formed with a normally-on device and a normally-off device.

Detailed description will now be provided to preferred embodiments of the present invention that are illustrated in the accompanying drawings. Wherever possible, identical reference numerals are used in the drawings and the description to refer to the same or like parts which have the identical function.

FIG. 1 shows a conventional cascode switching circuit including a normally-off silicon MOSFET 107 coupled in series with a normally-on JFET 105. The terminals of the drain, source, and gate of these two devices are labeled D, S, and G, respectively. The drain terminal of the normally-off silicon MOSFET 107 is coupled to the source terminal of the normally-on JFET 105, and the gate terminal of the normally-on JFET 105 is directly coupled to the source terminal of the normally-off silicon MOSFET 107, thereby forming a three-terminal normally-off cascode circuit, wherein the gate terminal of the normally-off silicon MOSFET 107 operates as the control terminal 109, the drain terminal of the normally-on JFET 105 operates as the drain terminal 101, and the source terminal of the normally-off silicon MOSFET 107 operates as the source terminal 103. When the voltage bias between the control terminal 109 and the source terminal 103 is zero, the normally-off silicon MOSFET 107 is operated in OFF-state, and the voltage drop across the drain and source terminals of the normally-off silicon MOSFET 107 will reverse bias the gate-source junction of the normally-on JFET 105 and force the normally-on JFET 105 to operate in the OFF-state. Therefore, the cascode switching circuit in FIG. 1 operates in normally-off mode.

Figure 2:
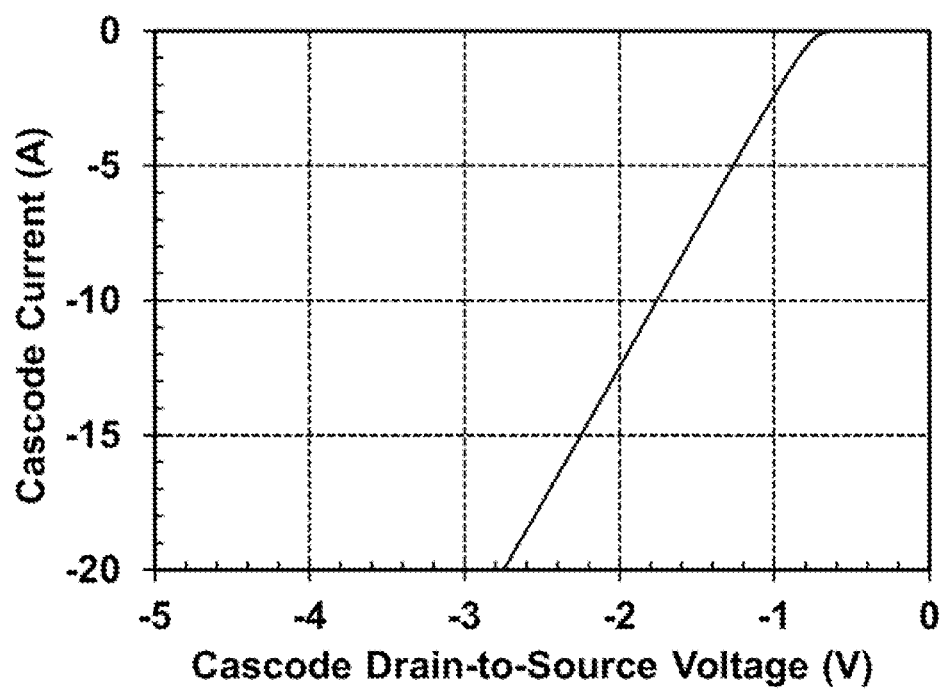
FIG. 2 is a plot illustrating the measured reverse current conduction characteristics at zero gate-source voltage bias of a conventional cascode circuit formed with a 1200 volts SiC normally-on JFET and a 25 volts silicon normally-off MOSFET. The cascode circuit has an on-resistance of 100 milliohms.

In the OFF-state, the voltage from the control terminal 109 to the source terminal 103 is in general equal to zero volts or even less than zero volts. If the voltage from the source terminal 103 to the drain terminal 101 is greater than zero volts, the body diode D1 of the normally-off silicon MOSFET 107 will be forward biased and the gate-source junction of the normally-on JFET 105 will be also forward biased. Hence, the cascode switching circuit in FIG. 1 can conduct a reverse current in OFF-state flowing through the body diode D1 of the normally-off silicon MOSFET 107 and the normally-on JFET 105 in reverse direction from the source terminal to the drain terminal FIG. 2 shows a plot of the measured reverse current as a function of the voltage from the drain terminal 101 to the source terminal 103 of the conventional cascode switching circuit in FIG. 1 formed with a 1200 volts SiC normally-on JFET and a 25 volts silicon normally-off MOSFET. This plot was obtained at zero voltage bias from the control terminal 109 to the source terminal 103. The cascode switching circuit in FIG. 1 has an on-resistance of 100 milliohms FIG. 2 demonstrates the reverse current conduction capability of the cascode switching circuit in FIG. 1.

Figure 3:
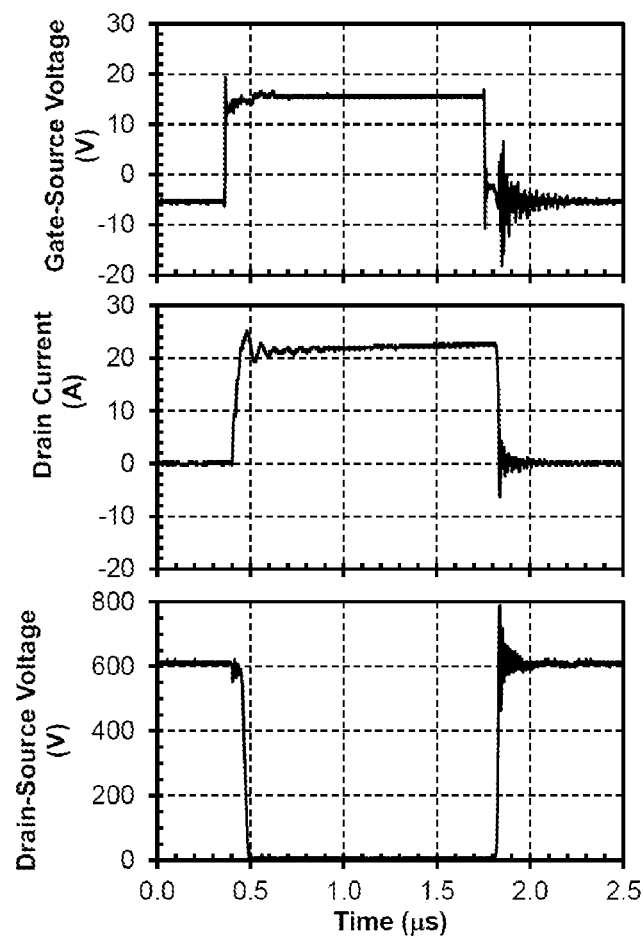
FIG. 3 is a plot illustrating the measured switching waveforms of a conventional cascode circuit formed with a 1200 volts SiC normally-on JFET and a 25 volts silicon normally-off MOSFET. The test was performed at 600 volts and 21 amperes inductive load condition. A 2.5 ohm resistor and a ferrite bead connected in series are connected to the gate of the silicon MOSFET to suppress the oscillations.

FIG. 3 shows a plot of the measured switching characteristics of the conventional cascode switching circuit in FIG. 1 formed with a 1200 volts SiC normally-on JFET and a 25 volts silicon normally-off MOSFET. The measurement was performed at 600 volts and 21 amperes inductive load condition. A 2.5 ohm resistor and a ferrite bead connected in series are connected to the control terminal 109 to suppress the oscillations. The turn-on waveforms are very clean, indicating a stable and well controlled turn-on process. However, at turn-off there are substantial oscillations on the cascode gate-source voltage, drain current and drain-source voltage, which may cause unstable operation of the device and raise issues of electromagnetic interference (EMI).

Various methods have been devised to control the cascode turn-off process, but these methods cannot preserve the cascode reverse current conduction capability, which is required by many power switching applications. The built-in diode needs to turn on without any active gate control when the current reverses direction, and turn off without active gate control when a reverse voltage is applied to it. An additional diode must be used in parallel with the cascode circuit to provide the reverse current conduction function with the aforementioned behavior.

The present invention provides a method to effectively control the turn-off process of the cascode switching circuit while preserving the reverse current conduction capability of the cascode switching circuit. In this method, a gate driver provides two outputs with the first output coupled to the gate terminal of the normally-on device and the second output coupled to the gate terminal of the normally-off device such that, during turn-off transient, the first output of the gate driver outputs a negative voltage pulse to actively switch off the normally-on device while the normally-off device is still kept in ON-state. In this way, the turn-off process of the cascode circuit is the same as the turn-off process of a single normally-on device that can be very well controlled. Once the turn-off process of the cascode circuit is finished, the second output of the gate driver outputs a signal to actively switch off the normally-off device, and then the first output of the gate driver returns to the state before the turn-off process that allows the normally-on device to conduct a reverse current.

Figure 4:
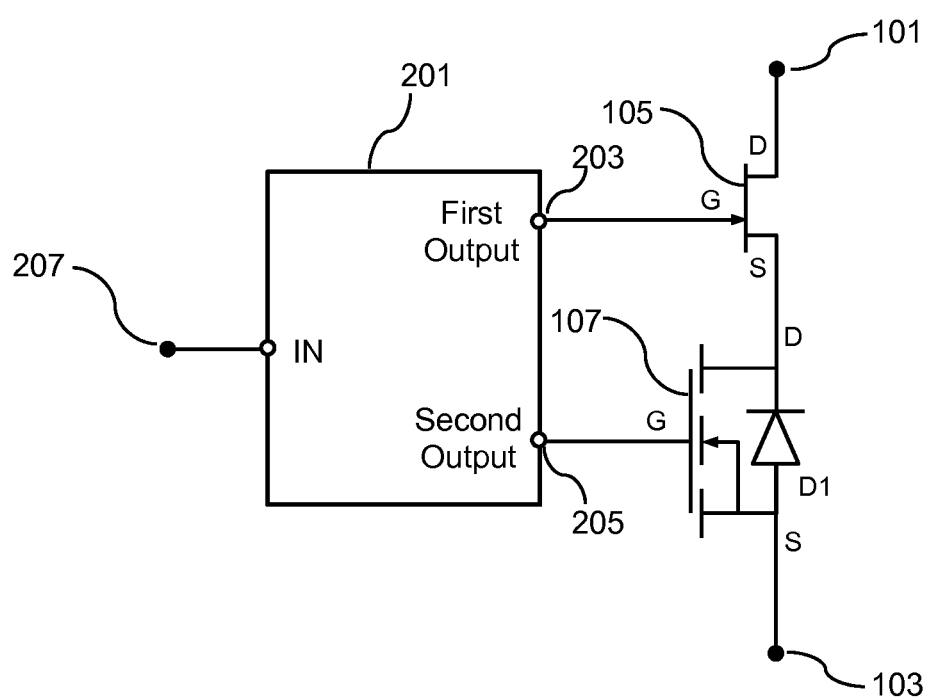
FIG. 4 is a circuit schematic diagram illustrating a cascode switching circuit in accordance with an embodiment of the present invention.

FIG. 4 shows a circuit schematic diagram of a cascode switching circuit in accordance with an embodiment of the invention including a normally-off silicon MOSFET 107 coupled in series with a normally-on JFET 105, and a gate driver 201. The terminals of the drain, source, and gate of the normally-on JFET 105 and the normally-off silicon MOSFET 107 are labeled D, S, and G, respectively. The drain terminal of the normally-off silicon MOSFET 107 is coupled to the source terminal of the normally-on JFET 105. The gate terminal of the normally-off silicon MOSFET 107 is coupled to the second output 205 of the gate driver 201. The gate terminal of the normally-on JFET 105 is coupled to the first output 203 of the gate driver 201. The input terminal of the gate driver 201, the drain terminal of the normally-on JFET 105, and the source terminal of the normally-off silicon MOSFET 107 operate as the control terminal 207, drain terminal 101, and source terminal 103 of the cascode switching circuit in FIG. 4, respectively. The gate driver 201 generates the first output 203 and the second output 205 according to the input signal from the control terminal 207.

Figure 5:
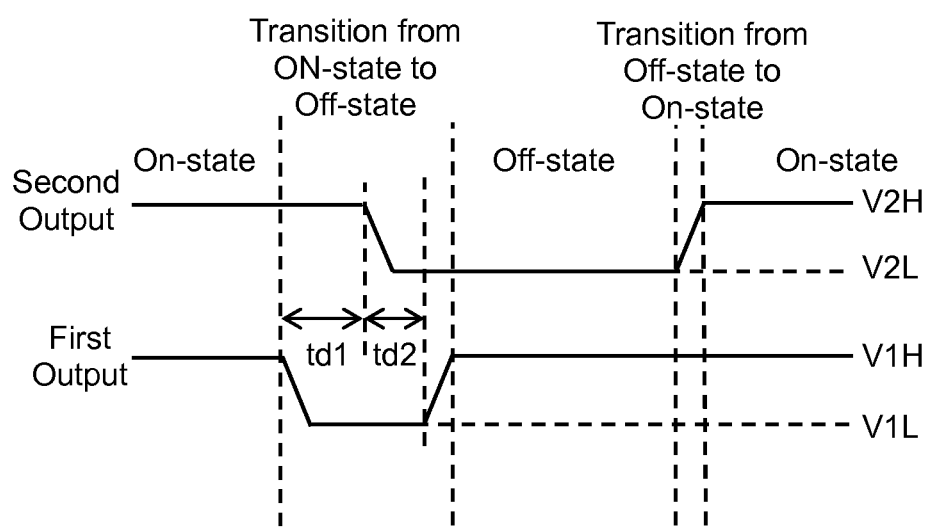
FIG. 5 is a diagram schematically illustrating the operation waveforms of the gate driver outputs for controlling the cascode switching circuit illustrated in FIG. 4.

FIG. 5 shows is a schematic diagram illustrating the operation waveforms of the cascode switching circuit in FIG. 4. In ON-state, the gate driver 201 produces a high level signal V2H on the second output 205 and a high level signal V1H on the first output 203. The high level signal V2H on the second output 205 is the turn-on voltage of the normally-off silicon MOSFET 107, and is typically in a range of from +3 volts to +15 volts with reference to the source terminal 103. The high level signal V1H on the first output 203 is the turn-on voltage of the normally-on JFET 105, and is typically in a range of from −2 volts to +3 volts with reference to the source terminal 103. In ON-state, the cascode switching circuit in FIG. 4 operates in the same way as the conventional cascode switching circuit in FIG. 1.

In OFF-state, the gate driver 201 produces a low level signal V2L on the second output 205 and maintains the high level signal V1H on the first output 203. The low level signal V2L on the second output 205 is the turn-off voltage of the normally-off silicon MOSFET 107, and is typically in a range of from −15 volts to 0 volts with reference to the source terminal 103. Since the high level signal V1H is maintained on the first output 203 of the gate driver 201 or the gate terminal of the normally-on JFET 105, the normally-on JFET 105 channel is ON and can conduct a reverse current, hence the cascode switching circuit in FIG. 4 can conduct a reverse current during OFF-state like the conventional cascode switching circuit in FIG. 1.

During the turn-on process, the gate driver 201 will cause a transition of the cascode switching circuit in FIG. 4 from OFF-state to ON-state by changing the second output 205 from the low level V2L to the high level V2H, while keeping the first output 203 at the high level V1H. During a turn-on process, the cascode switching circuit in FIG. 4 operates in the same way as the conventional cascode switching circuit in FIG. 1, meaning the turn-on process is controlled by controlling the normally-off silicon MOSFET 107.

During a turn-off process, the gate driver 201 will cause a transition of the cascode switching circuit in FIG. 4 from ON-state to OFF-state by producing a negative voltage pulse on the first output 203. The low level V1L of the negative voltage pulse is the turn-off voltage of the normally-on JFET 105 and is typically in a range of from −8 volts to −30 volts for SiC normally-on JFET with reference to the source terminal 103. During a turn-off process, the gate driver 201 first pulls down the first output 203 from the high level V1H to the low level V1L to turn off the normally-on JFET 105 while it maintains the second output 205 at the high level V2H to keep the normally-off silicon MOSFET 107 in ON-state. Once the normally-on JFET 105 is turned off, the cascode switching circuit in FIG. 4 will be in OFF-state. Because the normally-off silicon MOSFET 107 is kept in ON-state during turn-off transient, the turn-off process is the same as that of a single normally-on JFET, meaning the turn-off process is controlled by controlling the normally-on JFET. The control methods for the turn-off process of a single normally-on JFET have been studied extensively and are apparent to those skilled in the art.

After a first predetermined desired delay time td1, the gate driver 201 pulls down the second output 205 from the high level V2H to the low level V2L to actively set the normally-off silicon MOSFET 107 into OFF-state and, then after a second predetermined desired delay time td2, it pulls up the first output 203 from the low level V1L to the high level V1H. In this way, the OFF-state of the cascode switching circuit in FIG. 4 is maintained by actively setting the normally-off silicon MOSFET 107 into OFF-state, which returns the circuit to the same state as the conventional cascode switching circuit in FIG. 1.

The first predetermined desired delay time td1 is the time period during which the normally-on JFET 105 is turned off and no additional oscillations will be generated if the normally-off silicon MOSFET 107 is set into OFF-state. If an application circuit using the cascode switching circuit is designed to have very small parasitic inductances and is able to withstand high di/dt and dv/dt rates, then the first predetermined desired delay time td1 can be as small as 1 nanosecond, meaning the normally-on JFET 105 and the normally-off silicon MOSFET 107 are turned off almost at the same time. If an application circuit using the cascode switching circuit has large parasitic inductances, the first predetermined desired delay time td1 should be long enough to allow the normally-on JFET 105 to fully control the turn-off process. SiC normally-on JFETs in general can be turned off in less than 500 nanoseconds. A preferred range of the first predetermined desired delay time td1 is from 1 nanosecond to 500 nanoseconds. The second predetermined desired delay time td2 is the time period during which the normally-off silicon MOSFET 107 is set into OFF-state and no current spike or short-circuit condition will be generated if the first output 203 of the gate driver 201 is changed from the low level V1L to the high level V1H. The normally-off silicon MOSFET 107 can be turned off very fast, even less than 10 ns under this condition because it has no load current and a low drain voltage during switching. The first output 203 of the gate driver 201 must be changed from the low level V1L to the high level V1H before the cascode switching circuit needs to conduct a reverse current, which means the second predetermined desired delay time td2 should be as short as possible. A preferred range of the second predetermined desired delay time td2 is from 10 nanoseconds to 500 nanoseconds.

Figure 6:
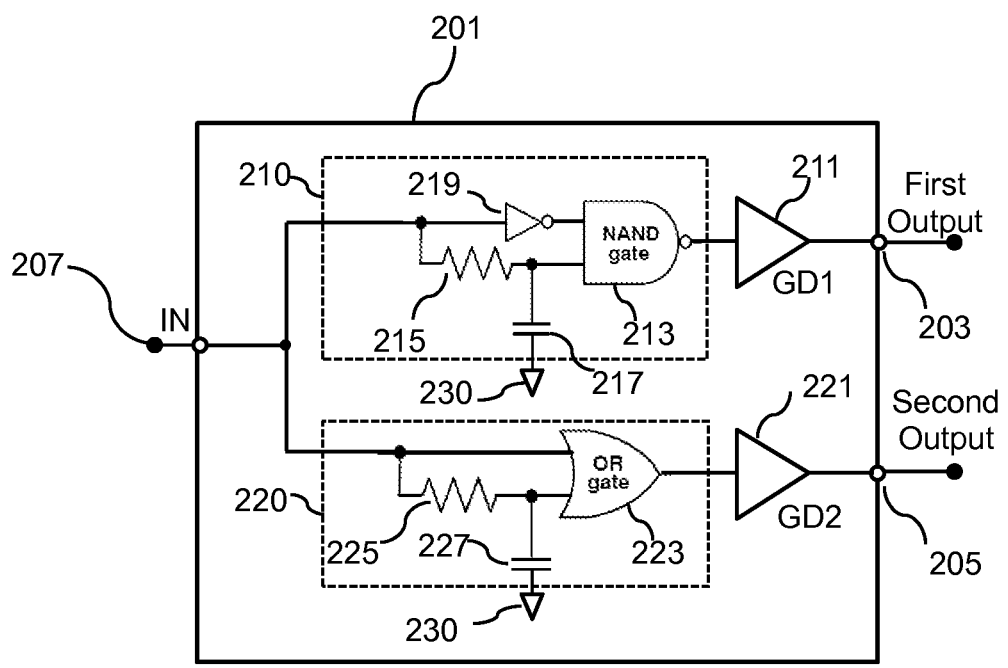
FIG. 6 is a circuit schematic diagram illustrating a non-limiting exemplary circuit to provide the operation waveforms of the gate driver outputs illustrated in FIG. 5 for controlling the cascode switching circuit illustrated in FIG. 4.

Various circuit topologies for a gate driver can be used to provide the operation waveforms of the gate driver outputs as illustrated in FIG. 5 for controlling the cascode switching circuit in FIG. 4. FIG. 6 shows a non-limiting exemplary topology of the gate driver circuit 201 including a first gate drive circuit 211, a second gate drive circuit 221, a negative pulse generator 210 and a falling edge delay circuit 220. The first gate drive circuit 211 generates an output signal having a high level of V1H and a low level of V1L, which are suitable for driving the normally-on JFET 105 in FIG. 4. The second gate drive circuit 221 generates an output signal having a high level of V2H and a low level of V2L, which are suitable for driving the normally-off silicon MOSFET 107 in FIG. 4. The output of the first gate drive circuit 211 is coupled to the first output 203. The output of the second gate drive circuit 221 is coupled to the second output 205. The output of the negative pulse generator 210 is coupled to the input of the first gate drive circuit 211. The output of the falling edge delay circuit 220 is coupled to the input of the second gate drive circuit 221. The control terminal 207 of the gate driver 201 is connected to both the input terminals of the negative pulse generator 210 and the falling edge delay circuit 220.

The negative pulse generator 210 includes an inverter 219, a resistor 215, a capacitor 217 and a NAND gate 213 provided with a first input and a second input. The negative pulse generator 210 is used to generate a negative pulse signal upon receiving a falling edge on the input signal from the control terminal 207. A falling edge is a transition of a logic signal from logic 1 to logic 0. The output terminal of the inverter 219 is connected to the first input terminal of the NAND gate 213. The input terminal of the inverter 219 is connected to the input terminal of the negative pulse generator 210. The resistor 215 is connected between the second input of the NAND gate 213 and the input terminal of the negative pulse generator 210. The capacitor 217 is connected between the second input of the NAND gate 213 and the gate driver signal ground reference 230. When a falling edge occurs on the input signal, the first input of the NAND gate 213 is changed from logic 0 to logic 1. The second input of the NAND gate 213 will maintain at logic 1 because the voltage across the capacitor 217 cannot change instantly. Therefore, the output of the NAND gate 213 will be changed from logic 1 to logic 0, which makes the output of the first gate drive circuit 211 change from the high level V1H to the low level V1L. The voltage across the capacitor 217 will decrease with time due to the discharge of the capacitor 217 through the resistor 215. When the voltage across the capacitor 217 is lower than the maximum voltage of logic 0, the second input of the NAND gate 213 becomes logic 0, making the output of the NAND gate 213 change from logic 0 to logic 1, which, in turn, makes the output of the first driver circuit 211 change from the low level V1L to the high level V1H. The product of the resistance of the resistor 215 and the capacitance of the capacitor 217 determines the time for the voltage across the capacitor 217 to fall down to the maximum voltage of logic 0 and further determines the pulse width of the negative voltage pulse on the first output 203. The desired pulse width of a sum of the first predetermined desired delay time td1 and the second predetermined desired delay time td2 as shown in FIG. 5 can be obtained by selecting proper resistance for the resistor 215 and proper capacitance for the capacitor 217.

The negative pulse generator 210 is a monostable, falling-edge triggered circuit and its output stays at logic 1 during steady-state. A leading edge, which is a transition of a signal from logic 0 to logic 1, will not change the output of the negative pulse generator 210.

The falling edge delay circuit 220 includes a resistor 225, a capacitor 227 and an OR gate 223 provided with a first input and a second input. The falling edge delay circuit 220 is used to generate a delay time for the falling edge of the input signal. The first input terminal of the OR gate 223 is connected to the input terminal of the falling edge delay circuit 220. The resistor 225 is connected between the second input of the OR gate 223 and the input terminal of the falling edge delay 220. The capacitor 227 is connected between the second input of the OR gate 223 and the gate driver signal ground reference 230.

When a falling edge appears on the input signal, the first input of the OR gate 223 is changed from logic 1 to logic 0 and the second input of the OR gate 223 will maintain at logic 1 because the voltage across the capacitor 227 cannot change instantly. Thus, the output of the OR gate 223 will not change and remains at logic 1. The voltage across the capacitor 227 will decrease with time due to the discharge of the capacitor 227 through the resistor 225. When the voltage across the capacitor 227 is lower than the maximum voltage of logic 0, the second input of the OR gate 223 becomes logic 0, making the output of the OR gate 223 change from logic 1 to logic 0, which, in turn, makes the output of the second driver circuit 221 change from the high level V2H to the low level V2L. The product of the resistance of the resistor 225 and the capacitance of the capacitor 227 determines the time for the voltage across the capacitor 227 to fall down to the maximum voltage of logic 0 and further determines the delay time of the falling edge of the input signal. The first predetermined desired delay time td1 as shown in FIG. 5 can be obtained by selecting proper resistance of the resistor 225 and proper capacitance of the capacitor 227. The falling edge delay circuit 220 has no effect on the leading edge of the input signal.

The concept of the present invention has thus been introduced according to an embodiment, wherein the normally-on semiconductor is a normally-on JFET and the normally-off semiconductor device is a normally-off silicon MOSFET. Other types of normally-on semiconductor devices and normally-off semiconductor devices can also be used to form the cascode switching circuit. The normally-on semiconductor device could be composed of a single device or multiple devices connected in parallel arrangement. Exemplary normally-on semiconductor devices include JFETs, MOSFETs, static induction transistors (SITs), and high electron mobility transistors (HEMTs); however, in general, SiC normally-on JFETs are preferred for the applications requiring a voltage blocking capability over 1000V and GaN normally-on HEMTs are preferred for the 650V class applications. These normally-on devices can conduct a reverse current from the source terminal to the drain terminal with a low voltage drop at zero gate-source voltage bias. The maximum blocking voltage of SiC JFET is about 10,000 volts. Above 10,000 volts, the SiC bipolar devices such as SiC insulated gate bipolar transistor (IGBT) or gate turn-off transistor (GTO) are preferred because they have a much lower on-resistance than SiC JFET. The preferred blocking voltage of SiC JFET is in a range of from 1000 volts to 4000 volts. The lateral structure and dielectric breakdown of GaN HEMT limits the maximum blocking voltage of power GaN HEMT. The preferred blocking voltage of GaN HEMT is in a range of from 300 volts to 1000 volts.

The normally-off semiconductor device could be composed of a single device or multiple devices connected in parallel arrangement with a blocking voltage in a range of from 10 volts from 100 volts. Exemplary normally-off semiconductor devices include JFETs, MOSFETs, static induction transistors (SITs), bipolar junction transistors (BJTs), and insulated-gate bipolar transistors (IGBTs); however, JFETs, SITs and BJTs are not preferred because, in general, they do not have a built-in body diode and therefore are not suitable for conducting a reverse current. They need an additional low voltage diode in order to conduct a reverse current. The low voltage normally-off silicon MOSFETs are generally preferred and the preferred voltage ratings of the low voltage silicon MOSFETs are typically from 20 volts to 50 volts. Silicon MOSFETs have a built-in body diode that can conduct a reverse current from the source terminal to the drain terminal during off-state In an embodiment, a cascode switching circuit includes a normally-on semiconductor device, a normally-off semiconductor device, and a gate driver. The normally-off semiconductor device has a current path coupled in series with a current path of the normally-on semiconductor device. The gate driver has a first output coupled to a gate terminal of the normally-on semiconductor device and a second output coupled to a gate terminal of the normally-off semiconductor device. The gate driver is configured such that the turn-on process of the cascode switching circuit is controlled by controlling the normally-off semiconductor device and the turn-off process of the cascode switching circuit is controlled by controlling the normally-on semiconductor device.

In an embodiment, the normally-on semiconductor device is a compound semiconductor device. In a preferred embodiment, the normally-on semiconductor device is a SiC JFET. In another preferred embodiment, the normally-on semiconductor device is a GaN HEMT. In an embodiment, the cascode switching circuit is switched off by turning off the normally-on semiconductor device. In an embodiment, the cascode switching circuit is switched on by turning on the normally-off semiconductor device In an embodiment, a method of controlling switching process of a cascode switching circuit is provided including providing a normally-on semiconductor device with a current path coupled in series with a current path of a normally-off semiconductor device and a gate driver configured such that the turn-on process of the cascode switching circuit is controlled by controlling the normally-off semiconductor device, and the turn-off process of the cascode switching circuit is controlled by controlling the normally-on semiconductor device.

In an embodiment, the method includes forming the normally-on semiconductor device with a compound semiconductor. In an embodiment, the method includes forming the compound semiconductor device with a silicon carbide JFET. In an embodiment, the method includes forming the compound semiconductor device with a GaN HEMT. In an embodiment, the method includes forming the normally-off semiconductor device with a silicon MOSFET. In an embodiment, the method includes turning on the cascode switching circuit by turning on the normally-off semiconductor device. In an embodiment, the method includes turning off the cascode switching circuit by turning off the normally-on semiconductor device.

The description above indicates that a great degree of flexibility is offered in terms of the invention. Although various embodiments have been described in considerable detail with reference to certain preferred versions thereof, other versions are possible. Therefore, the spirit and scope of the appended claims should not be limited to the description of the preferred versions contained herein.

What is claimed:

1. A cascode switching circuit comprising a normally-on semiconductor device, a normally-off semiconductor device, and a gate driver, wherein:
    said normally-on semiconductor device and said normally-off semiconductor device each have a gate terminal, a drain terminal and a source terminal;
    said gate driver has a first output and a second output;
    said first output of said gate driver is coupled to said gate terminal of said normally-on semiconductor device;
    said second output of said gate driver is coupled to said gate terminal of said normally-off semiconductor device;
    said drain terminal of said normally-off semiconductor device is coupled to said source terminal of said normally-on semiconductor device so that a current path is formed through said normally-on semiconductor device and said normally-off semiconductor device;
    said gate driver is configured such that a turn-on process of said cascode switching circuit is controlled by controlling said normally-off semiconductor device;
    a turn-off process of said cascode switching circuit is controlled by controlling said normally-on semiconductor device; and
    during said turn-off process of said cascode switching circuit, said gate driver causes a transition of said cascode switching circuit from ON-state to OFF-state by
        changing said first output of said gate driver from a first voltage level to a second voltage level to turn off said normally-on semiconductor device,
        then after a first predetermined delay time, changing said second output of said gate driver from a third voltage level to a fourth voltage level to turn off said normally-off semiconductor device, and
        after a second predetermined delay time, changing said first output of said gate driver from said second voltage level to said first voltage level.

2. The cascode switching circuit of claim 1 wherein said normally-on semiconductor device comprises a compound semiconductor device.

3. The cascode switching circuit of claim 2 wherein said compound semiconductor device comprises a silicon carbide device.

4. The cascode switching circuit of claim 3 wherein said silicon carbide device comprises a silicon carbide junction field effect transistor.

5. The cascode switching circuit of claim 2 wherein said compound semiconductor device comprises a gallium nitride device.

6. The cascode switching circuit of claim 5 wherein said gallium nitride device comprises a gallium nitride high electron mobility transistor.

7. The cascode switching circuit of claim 1 wherein said normally-off semiconductor device comprises a silicon metal oxide semiconductor field effect transistor.

8. The cascode switching circuit of claim 1 wherein, during said turn-on process of said cascode switching circuit, said gate driver causes a transition of said cascode switching circuit from OFF-state to ON-state by changing said second output of said gate driver from said fourth voltage level to said third voltage level to turn on said normally-off semiconductor device, meanwhile maintaining said first output of said gate driver at said first voltage level.

9. The cascode switching circuit of claim 1 wherein said first predetermined delay time has a value in the range of from about 1 nanosecond to about 500 nanoseconds, and said second predetermined delay time has a value in the range of from about 10 nanoseconds to about 500 nanoseconds.

10. The cascode switching circuit of claim 1 wherein, with a ground reference to said source terminal of said normally-off semiconductor device, said first voltage level has a value in the range of from about −2 volts to 3 volts, said second voltage level has a value in the range of from about −8 volts to −30 volts, said third voltage level has a value in the range of from about 3 volts to 15 volts, and said fourth voltage level has a value in the range of from about 0 volts to −15 volts.

11. The cascode switching circuit of claim 1 wherein said normally-on semiconductor device comprises a semiconductor device, or more than one semiconductor devices connected in parallel, with a voltage blocking capability in the range of from about 300 volts to about 10,000 volts.

12. The cascode switching circuit of claim 11 wherein said normally-off semiconductor device comprises a semiconductor device, or more than one semiconductor devices connected in parallel, with a voltage blocking capability in the range of from about 10 volts to about 100 volts.

13. The cascode switching circuit of claim 1 wherein said gate driver further comprises a single control terminal.

14. The cascode switching circuit of claim 13 wherein said single control terminal of said gate driver controls the generation of said first output and said second output of said gate driver.

15. A method of operating a cascode by a gate driver, the method comprising:
controlling a turn-on process of said cascode by said gate driver controlling said normally-off semiconductor device; and
controlling a turn-off process of said cascode by said gate driver controlling said normally-on semiconductor device,
wherein, during said turn-off process of said cascode, said gate driver causes a transition of said cascode from ON-state to OFF-state by changing said first output of said gate driver from a first voltage level to a second voltage level to turn off said normally-on semiconductor device, then after a first predetermined delay time, changing said second output of said gate driver from a third voltage level to a fourth voltage level to turn off said normally-off semiconductor device, and after a second predetermined delay time, changing said first output of said gate driver from said second voltage level to said first voltage level,
wherein the cascode comprises a normally-on semiconductor device and a normally-off semiconductor device each having a gate terminal, a drain terminal, and a source terminal, said drain terminal of said normally-off semiconductor device being coupled to said source terminal of said normally-on semiconductor device so that a current path is formed through said normally-on semiconductor device and said normally-off semiconductor device, and
wherein the gate driver comprises a first output and a second output coupled to said gate terminals of said normally-on and normally-off semiconductor device respectively.

16. The method of claim 15, wherein said normally-on semiconductor device comprises a compound semiconductor device.

17. The method of claim 16 wherein said compound semiconductor device comprises a silicon carbide device.

18. The method of claim 17, wherein said silicon carbide device comprises a silicon carbide junction field effect transistor.

19. The method of claim 16 wherein said compound semiconductor device comprises a gallium nitride device.

20. The method of claim 19 wherein said gallium nitride device comprises a gallium nitride high electron mobility transistor.

21. The method of claim 15 wherein said normally-off semiconductor device comprises a silicon metal oxide semiconductor field effect transistor.

22. The method of claim 15, wherein, during said turn-on process of said cascode, said gate driver causes a transition of said cascode from OFF-state to ON-state by changing said second output of said gate driver from said fourth voltage level to said third voltage level to turn on said normally-off semiconductor device, meanwhile maintaining said first output of said gate driver at said first voltage level.

23. The method of claim 15, wherein said first predetermined delay time has a value in the range of from about 1 nanosecond to about 500 nanoseconds, and said second predetermined delay time has a value in the range of from about 10 nanoseconds to about 500 nanoseconds.

24. The method of claim 15 wherein, with a ground reference to said source terminal of said normally-off semiconductor device, said first voltage level has a value in the range of from about −2 volts to 3 volts, said second voltage level has a value in the range of from about −8 volts to −30 volts, said third voltage level has a value in the range of from about 3 volts to 15 volts, and said fourth voltage level has a value in the range of from about 0 volts to −15 volts.

25. The method of claim 15 wherein said normally-on semiconductor device comprises a semiconductor device, or more than one semiconductor devices connected in parallel, with a voltage blocking capability in the range of from about 300 volts to about 10000 volts.

26. The method of claim 25 wherein said normally-off semiconductor device comprises a semiconductor device, or more than one semiconductor devices connected in parallel, with a voltage blocking capability in the range of from about 10 volts to about 100 volts.

27. The method of claim 15 wherein said gate driver operates according to a single input signal.

28. The method of claim 27 wherein said gate driver generates said first output and said second output of said gate driver according to said single input signal of said gate driver.

* * * * *